(12) United States Patent
Bae et al.

(10) Patent No.: US 8,399,901 B2
(45) Date of Patent: Mar. 19, 2013

(54) LIGHT EMITTING DEVICE

(75) Inventors: Duk Kyu Bae, Seoul (KR); Hyun Kyong Cho, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 357 days.

(21) Appl. No.: 12/522,247

(22) PCT Filed: Jan. 9, 2009

(86) PCT No.: PCT/KR2009/000141
§ 371 (c)(1),
(2), (4) Date: Jul. 6, 2009

(87) PCT Pub. No.: WO2009/088260
PCT Pub. Date: Jul. 16, 2009

(65) Prior Publication Data
US 2011/0169041 A1 Jul. 14, 2011

(30) Foreign Application Priority Data
Jan. 11, 2008 (KR) .................. 10-2008-0003387

(51) Int. Cl.
*H01L 33/00* (2010.01)

(52) U.S. Cl. .......................... 257/99; 438/125

(58) Field of Classification Search .................... 257/99; 438/125
See application file for complete search history.

(56) References Cited

U.S. PATENT DOCUMENTS

| | | | | |
|---|---|---|---|---|
| 5,779,924 A * | 7/1998 | Krames et al. | ................. | 216/24 |
| 6,825,056 B2 * | 11/2004 | Asakawa et al. | ................. | 438/47 |
| 7,037,738 B2 * | 5/2006 | Sugiyama et al. | ............. | 438/29 |
| 7,250,638 B2 * | 7/2007 | Lee et al. | ........................ | 257/99 |
| 7,768,025 B2 * | 8/2010 | Jang et al. | ....................... | 257/98 |
| 7,834,374 B2 * | 11/2010 | Jang et al. | ....................... | 257/99 |
| 2008/0023691 A1 * | 1/2008 | Jang et al. | ....................... | 257/13 |
| 2008/0251193 A1 | 10/2008 | Takenaka et al. | | |

FOREIGN PATENT DOCUMENTS

| | | |
|---|---|---|
| JP | 2004-247654 A | 9/2004 |
| JP | 2006-210491 A | 8/2006 |
| KR | 10-0600373 B1 | 7/2006 |

* cited by examiner

*Primary Examiner* — Chuong A Luu
*Assistant Examiner* — Robert Bachner
(74) *Attorney, Agent, or Firm* — Birch, Stewart, Kolasch & Birch, LLP

(57) ABSTRACT

Disclosed is a light emitting device. The light emitting device comprises a light emitting semiconductor layer comprising a first conductive semiconductor layer, an active layer and a second conductive semiconductor layer, a first passivation layer on the light emitting semiconductor layer, and a second passivation layer on the first passivation layer and has an elastic modulus of 2.0 to 4.0 GPa.

17 Claims, 3 Drawing Sheets

[Figure 1]
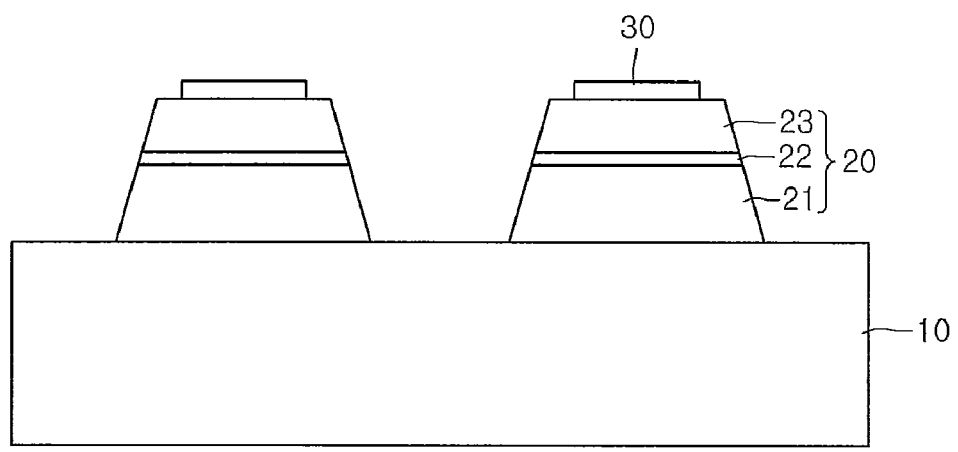
[Figure 2]
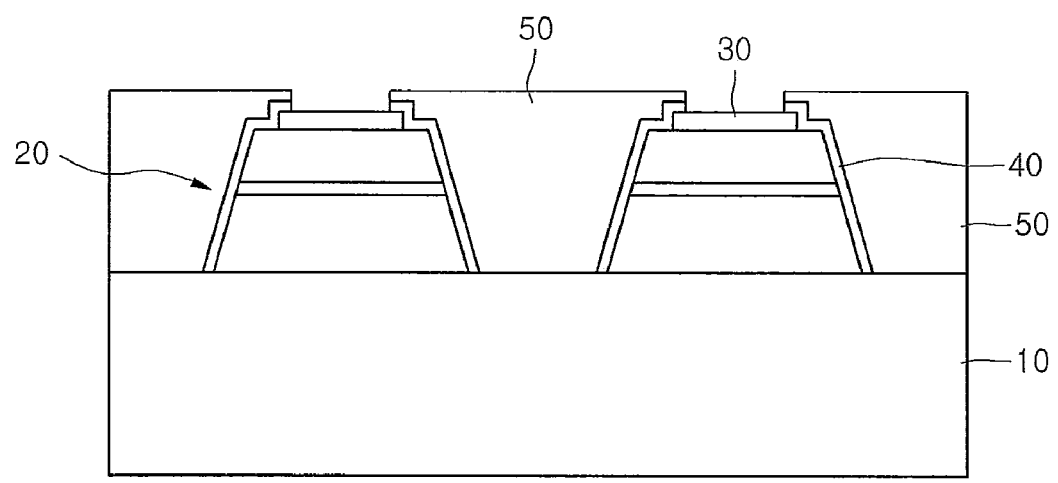

[Figure 3]
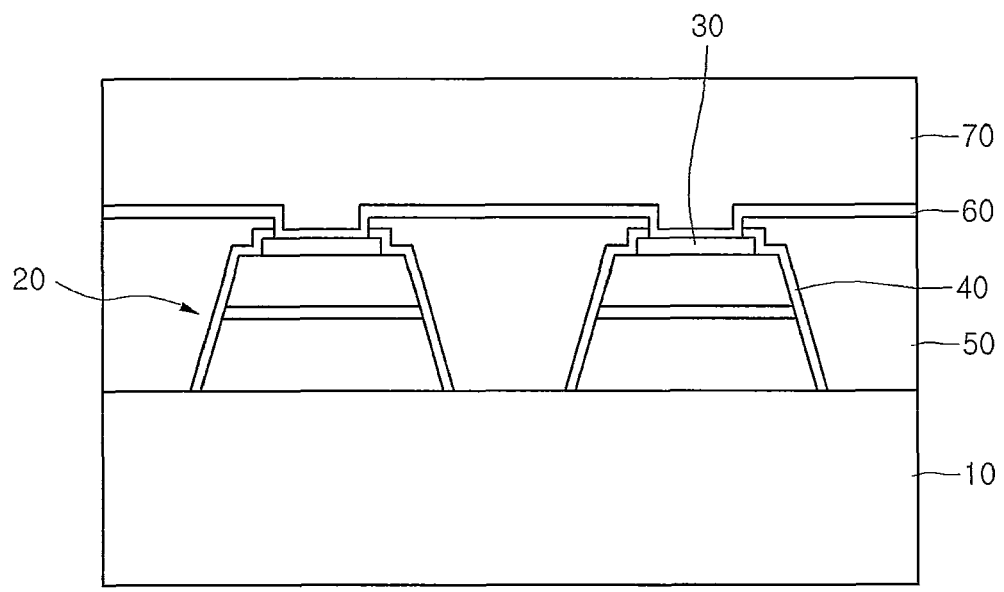
[Figure 4]
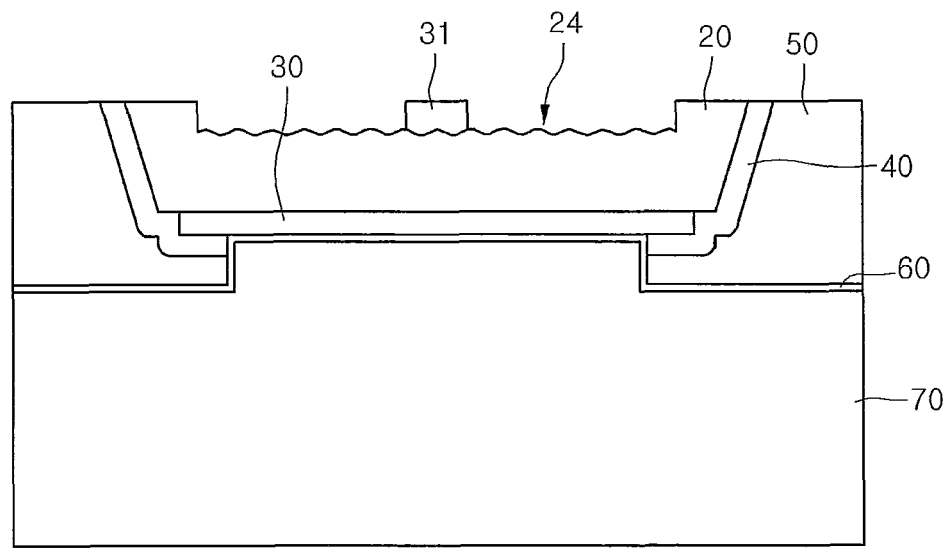

[Figure 5]
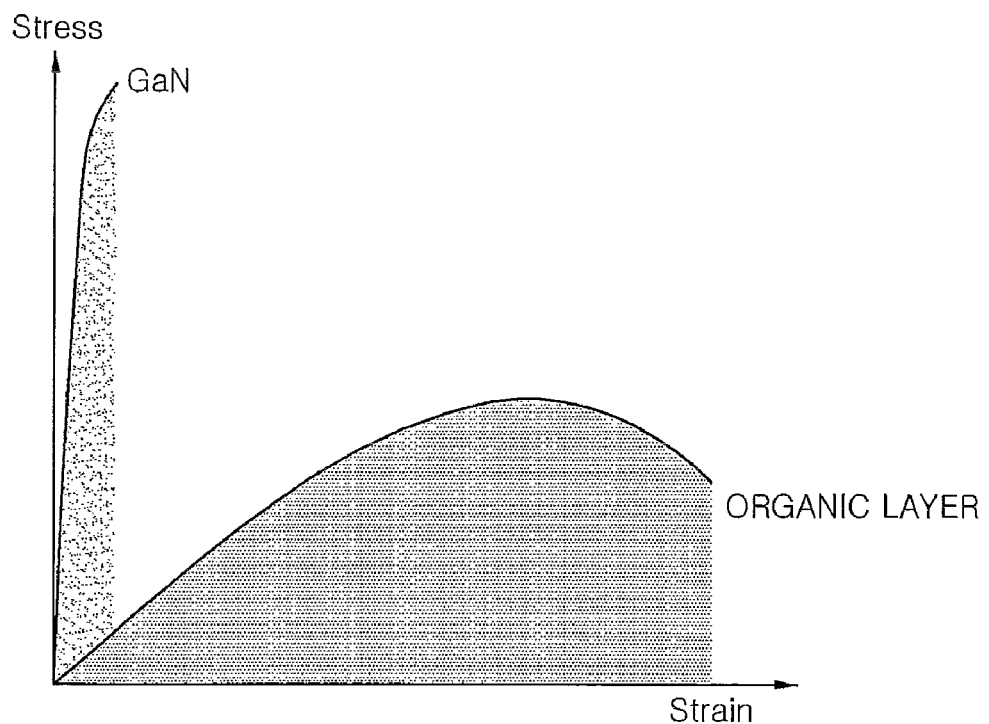
[Figure 6]
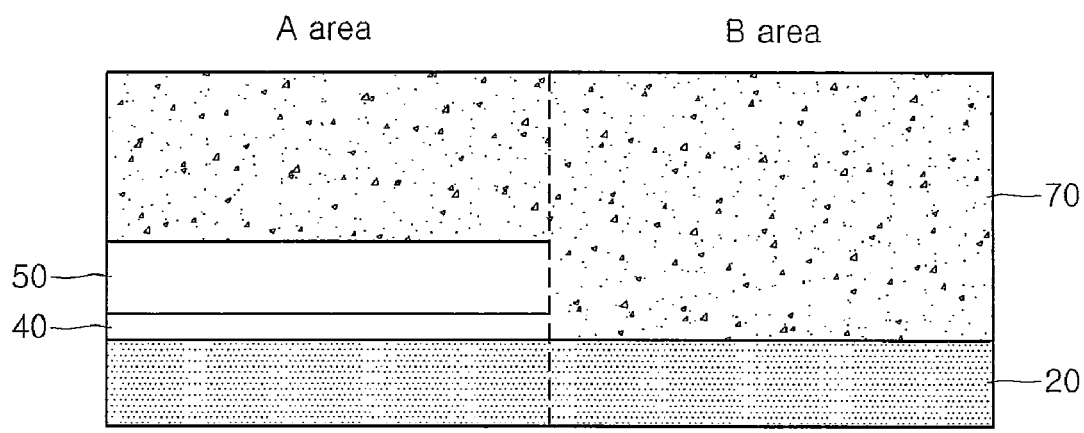

LIGHT EMITTING DEVICE

TECHNICAL FIELD

The present embodiment relates to a light emitting device.

BACKGROUND ART

An LED (LIGHT EMITTING DIODE) is a semiconductor light emitting device for converting current to light.

A wavelength of light emitted by the LED depends on semiconductor materials used for manufacturing the LED. This is because the wavelength of emitted light varies depending on a band gap of the semiconductor materials, which represents difference in energy between valence band electrons and conduction band electrons.

Recently, the brightness of LED has been increased so that the LED is used as a light source for a display apparatus, an illumination device, and a light source for a vehicle. In addition, the LED can emit white light having superior efficiency by using fluorescent material or by combining LEDs having various colors.

SUMMARY OF THE INVENTION

The embodiment provides a light emitting device.

The embodiment provides a light emitting device comprising a passivation layer capable of preventing current leakage while effectively absorbing shock.

A light emitting device according to the embodiment comprises a light emitting semiconductor layer comprising a first conductive semiconductor layer, an active layer and a second conductive semiconductor layer, a first passivation layer on the light emitting semiconductor layer, and a second passivation layer on the first passivation layer and has an elastic modulus of 2.0 to 4.0 GPa.

A light emitting device according to the embodiment comprises a support layer, a first electrode layer on the support layer, a light emitting semiconductor layer on the first electrode layer, a second electrode layer on the light emitting semiconductor layer, a first passivation layer which surrounds the light emitting semiconductor layer and comprises inorganic material, and a second passivation layer which surrounds the first passivation layer and comprises organic material.

The embodiment provides a light emitting device.

The embodiment provides a light emitting device comprising a passivation layer capable of preventing current leakage while effectively absorbing shock.

DESCRIPTION OF DRAWINGS

FIGS. 1 to 4 are views showing a light emitting device and a method for manufacturing the same according to the embodiment;

FIG. 5 is a view showing distribution of strain and stress on a light emitting semiconductor layer including a GaN semiconductor layer and a second passivation layer including an organic layer in the light emitting device having a structure shown in FIG. 4; and FIG. 6 is a schematic view showing the light emitting device to explain pressure applied to the light emitting device having a structure shown in FIG. 4.

DESCRIPTION OF THE EMBODIMENTS OF THE INVENTION

Hereinafter, embodiments of the present invention will be described in detail with reference to the accompanying drawings.

The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art.

The same reference numerals are used to designate the same elements throughout the drawings. In the drawings, the sizes and relative sizes of layers and regions may be exaggerated for clarity.

It will be understood that when an element such as a layer, a region or a substrate is referred to as being "on" or "under" another element, it can be directly on the other element or intervening elements may be present. When a part of an element such as a surface is referred to as a term "inner", it will be understood that the part is far away from a device as compared with other parts of the element.

It will be understood that such terms include other directions of the device in addition to the directions shown in the drawings. Last, when an element is referred to as being "directly on" another element, there are no intervening elements present. As used herein, the term "and/or" includes any and all combinations of one or more of the associated listed item.

Even if terms "first" and "second" are used to describe various elements, components, areas, layers and/or regions, such elements, components, areas, layers and/or regions are not limited to the terms.

The embodiments will be described with reference to a gallium nitride (GaN)-based light emitting device formed on a nonconductive substrate, such as a sapphire ($Al_2O_3$) substrate. However, the present invention is not limited thereto.

The embodiments may include other substrates, such as a conductive substrate. Accordingly, the present embodiment includes an AlGaInP diode formed on a GaP substrate, a GaN diode formed on a SiC substrate, a SiC diode formed on a SiC substrate, a SiC diode formed on a sapphire substrate, and/or a nitride-based diode formed on GaN, SiC, AlN, ZnO and/or other substrate, or a combination thereof. In addition, an active area according to the embodiment is not intended to be used for an area of a light emitting diode. In addition, the active area can be provided in various forms according to other embodiments.

In order to ensure structural stability of the light emitting device and prevent current leakage in the light emitting device, a passivation layer can be formed on an exposed surface of a semiconductor layer constituting the light emitting device when manufacturing the light emitting device.

In particular, in the case of a vertical type light emitting device, the passivation layer protects the semiconductor layer and also absorbs shock and stress that occur when the substrate is removed. For this reason, the passivation layer serves as an important component.

The refractive index and dielectric constant are the most basic properties to be considered when selecting materials used for the passivation layer of the light emitting device. Preferably, the refractive index (n) of material used for the passivation layer must be within the range between 2.4 to 1.0, in which refractive index of GaN is 2.4 and refractive index of air is 1.0. In this case, light can be efficiently extracted from the light emitting device. Preferably, if the material used for the passivation layer has excellent dielectric constant, electric passivation can be effectively achieved, that is, current leakage can be efficiently prevented.

However, since the vertical type light emitting device needs to be subject to high stress circumstance caused by a laser lift off process, which is performed to remove the substrate using laser, the passivation layer requires strong mechanical property.

That is, during the laser lift off process, a large amount of shock waves is generated. Since the GaN semiconductor is very brittle, the GaN semiconductor is easily broken by the shock waves.

Accordingly, the passivation layer designed by taking the shock due to the laser lift off into consideration must efficiently absorb the shock generated during the laser lift off process, and must have strong adhesion strength to securely fix the GaN semiconductor.

Inorganic material, such as $SiO_2$ or SiN, which is commonly used as passivation material, has superior adhesion property. However, the inorganic material is very brittle and has a limitation in absorbing shock.

Accordingly, it is necessary to provide a passivation layer capable of reinforcing mechanical stability while maintaining excellent dielectric constant and heat-resistant property similar to those of the inorganic layer.

Embodiment

FIGS. 1 to 4 are views showing a light emitting device and a method for manufacturing the same according to the embodiment.

As shown in FIG. 1, in the vertical type light emitting device, a light emitting semiconductor layer 20 is formed on a substrate 10 and a unit device division area is etched in the light emitting semiconductor layer 20 through an etching process. The light emitting semiconductor layer 20 includes a first conductive semiconductor layer 21, an active layer 22 and a second conductive semiconductor layer 23.

The first conductive semiconductor layer 21 is provided in the form of a nitride semiconductor layer including n-type impurities, and the second conductive semiconductor layer 23 is provided in the form of a nitride semiconductor layer including p-type impurities.

After that, a first electrode layer 30 is formed on the unit device that is formed through the etching process.

As shown in FIG. 2, a first passivation layer 40 is formed on the light emitting semiconductor layer 20 exposed through the etching process, and a second passivation layer 50 is formed on the first passivation layer 40.

The first passivation layer 40 may make contact with the light emitting semiconductor layer 20 and the first electrode layer 30. In addition, the second passivation layer 50 is filled in a space defined through the etching process.

That is, in the light emitting device according to the embodiment, a passivation layer has a dual structure including the first passivation layer 40 and the second passivation layer 50. The first passivation layer 40 includes an inorganic layer, and the second passivation layer 50 includes an organic layer.

In addition, in the light emitting device according to another embodiment, the passivation layer may have a complex structure including at least three layers in which a third passivation layer and a fourth passivation layer are additionally formed on the first passivation layer 40 and the second passivation layer 50.

As shown in FIG. 3, a coupling metal layer 60 is formed on the first electrode layer 30 and the second passivation layer 50, and then a support layer 70 is formed on the coupling metal layer 60. The support layer 70 supports a light emitting structure during a process of separating the substrate 10, and includes a conductive semiconductor layer or metal.

Then, the substrate 10 is removed through a laser lift off process, and a subsequent process including the process of forming a light extraction structure 24 and a second electrode layer 31 is perform, thereby achieving a structure shown in FIG. 4.

In the light emitting device according to the embodiment, the second passivation layer 50 including the organic layer mainly serves as a stress buffer, thereby improving impact-resistant property of the light emitting device. The first passivation layer 40 including the inorganic layer improves dielectric constant, heat-resistant property and light extraction efficiency.

The impact-resistant property described above is a basic property necessary for a stress buffer layer, and represents the ability of the passivation layer absorbing the impact wave generated during the laser lift off process.

The GaN semiconductor basically has elastic modulus 100 times higher than that of a general organic layer, and is very brittle. In addition, since the GaN semiconductor having a plate shape with a thickness less than 10 μm is easily subject to an x-y biaxial stress, the plate-shape GaN semiconductor has a brittleness higher than that of a bulk-shape GaN semiconductor.

Meanwhile, most organic layers have low elastic modulus, high elongation, and a volume larger than that of a GaN semiconductor thin film, so the organic layer can efficiently absorb impact energy.

Accordingly, if a complex structure including the inorganic layer and the organic layer is used, the mechanical property of the light emitting device is remarkably improved as compared with that of the light emitting device including only the organic layer.

However, if the organic layer is excessively deformed during a process of absorbing impact, a mismatch may occur relative to an adjacent part, so stress is adversely concentrated.

Accordingly, the ability of absorbing impact energy must be considered together with the elastic modulus. Table 1 represents physical properties of the organic layer and the inorganic layer used as the GaN layer and the passivation layer.

TABLE 1

| | Mechanical Property | Thermal Property | | | Electrical Property |
|---|---|---|---|---|---|
| | Elastic Modulus | Tg (Glass Transition) | Thermal Stability | CTE | Dielectric Constant |
| GaN | 380 GPa | — | 600° C. or above | — | — |
| $SiO_2$ | 73 GPa | — | 600° C. or above | Lower than 1 ppm | 3-4 |
| $Si_3N_4$ | 310 GPa | — | 600° C. or above | 3-4 ppm | 6-9 |
| $TiO_2$ | 228 GPa | — | 600° C. or above | 10-20 ppm | 14-110 |
| Imide based | 2.5-3 GPa | 250-350° C. | 400° C. (1% loss) | 20-60 ppm | 3.2-3.4 |
| Acryl based | Lower than 2.5 GPa | 150-200□ | 300° C. (5% loss) | Lower than 100 ppm | 3.2-3.4 |
| Epoxy based | Lower than 2.5 GPa | 150-250□ | 300° C. (5% loss) | 50-50 ppm | 3.2-3.4 |

As described above, the second passivation layer 50 includes the organic layer and mainly serves to absorb impact energy generated during the laser lift off process. During the laser lift off process, the shock waves are generated from a boundary between the substrate 10 including sapphire and the light emitting semiconductor layer 20 including the GaN semiconductor as the light emitting semiconductor layer 20 is decomposed as follows:

$$2GaN + h\nu \rightarrow 2Ga(s) + N_2(g)$$

Pressure generated in this case is about 40 MPa at the minimum.

FIG. 5 is a view showing distribution of strain and stress on a light emitting semiconductor layer including a GaN semiconductor layer and a second passivation layer including an organic layer in the light emitting device having a structure shown in FIG. 4, and FIG. 6 is a schematic view showing the light emitting device to explain pressure applied to the light emitting device having a structure shown in FIG. 4.

Referring to FIGS. 5 and 6, in brief, the light emitting device is divided into an A area, on which the support layer 70, the second passivation layer 50, the first passivation layer 40 and the light emitting semiconductor layer 20 are disposed, and a B area, on which the support layer 70 and the light emitting semiconductor layer 20 are disposed.

Pressure ($P_A$) applied to the A area and pressure ($P_B$) applied to the B area are as follows:

$$P_A = E_{GaN} * \epsilon_{GaN} + E_{inorganic\ layer} * \epsilon_{inorganic\ layer} + E_{organic\ layer} * \epsilon_{organic\ layer} + E_{support\ layer} * \epsilon_{support\ layer}$$

$$P_B = E_{GaN} * \epsilon_{GaN} + E_{support\ layer} * \epsilon_{support\ layer}$$

Herein, E represents elastic modulus, and E represents strain.

In this state, when the same pressure is applied to the A area and the B area, the second passivation layer 50 having low elastic modulus is primarily compressed in the A area, so relatively great strain occurs. However, in the B area, the light emitting semiconductor layer 20 having high elastic modulus and the support layer 70 are stacked up against each other, so strain may not excessively occur.

That is, as shown in FIG. 5, the GaN forming the light emitting semiconductor layer 20 exhibits small strain due to stress, but the organic layer forming the second passivation layer 50 exhibits great strain due to stress. In this case, the integral area represents the absorption amount of impact energy.

Such an inconsistence of the strain causes stress at a boundary between the A area and the B area. The stress concentrated on the boundary is 200 to 300 times greater than the stress occurring during the laser lift off process.

For example, if the stress during the laser lift off process is approximately calculated as 40 MPa, the stress concentrated on the boundary is about 8 to 12 GPa or above.

Accordingly, the organic layer used as the second passivation layer 50 preferably has elastic modulus of about 2.0 to 4.0 GPa.

If the elastic modulus of the second passivation layer 50 is lower than 2.0 GPa, the possibility of crack in the light emitting semiconductor layer 20 is highly increased due to the inconsistence of strain. If the elastic modulus of the second passivation layer 50 is higher than 4.0 GPa, the second passivation layer 50 hardly absorbs stress, so the stress is directly transferred to adjacent layers.

In the case of the inorganic layer used as the first passivation layer 40, the electric property or thermal stability must be considered prior to the mechanical properties. For example, material having low dielectric constant and superior thermal stability is suitable for the first passivation layer 40.

If the dielectric constant of the first passivation layer 40 is higher than $2.0 \times 10^{-6}$, the first passivation layer 40 is suitable for an insulator. If the dielectric constant is high, the superior insulating property is resulted. For this reason, material having high dielectric constant is desired and the maximum value of the dielectric constant is not important. However, when considering existing dielectric materials, the maximum value of the dielectric constant is about $200 \times 10^{-6}$.

Meanwhile, if the mass loss of the second passivation layer 50 is less than 3% under the conditions of the temperature of 200° and the process time of 72 hours, the material is regarded to be thermally stable and suitable for the second passivation layer 50. This is because if more than 3% of mass loss occurs in the organic layer due to decomposition by heat, the ability of maintaining the structure is lost.

In addition, if the mass loss of the second passivation layer 50 is less than 1% at the temperature of 600° or above, which corresponds to the melting temperature of an alloy forming various electrodes, the material forming the second passivation layer 150 is regared to be thermally stable.

If the first passivation layer 40 is disposed between the light emitting semiconductor layer 20 and the second passivation layer 50, strong adhesion strength is required. This is because the stress generated from the first passivation layer 40 or the light emitting semiconductor layer 20 must be efficiently transferred to the second passivation layer 50 serving as a shock absorption member.

Adhesion between the light emitting semiconductor layer 20 and the first passivation layer 40 including inorganic layer is performed through high temperature deposition or plasma deposition, so the adhesion strength is very strong. However, the adhesion between the first passivation layer 40 including the inorganic layer and the second passivation layer 50 including the organic layer is performed at a low temperature of 200° C., so the adhesion strength is relatively weak. The first passivation layer 40 including the inorganic layer primarily needs to overcome stress of 40 MPa generated during the laser lift off process, so the adhesion strength between the second passivation layer 50 including the organic layer and the first passivation layer 40 including the inorganic layer is preferably provided into 40 MPa or above.

Since it is better if the adhesion strength becomes stronger, the maximum value of the adhesion strength is not important. However, when considering conventional organic layer and inorganic layer, the maximum value of the adhesion strength between the organic layer and inorganic layer is about 1000 MPa.

The adhesion strength between the organic layer and inorganic layer generally depends on the adhesion strength of the organic layer. However, if a surface of the inorganic layer, for example, a silicon oxide layer ($SiO_2$) has an insufficient affinity with respect to the organic layer, the inorganic layer is subject to a surface treatment, such as chemical treatment, to improve the adhesion strength. After that, the organic layer is formed.

As described above, in the exposed surface of the light emitting semiconductor layer 20, the organic layer forming the second passivation layer 50 absorbs shock, thereby improving the mechanical stability of the device. In addition, at the high temperature, the thermal stability of the device is improved due to the inorganic layer forming the first passivation layer 40.

The first passivation layer 40 and the second passivation layer 50 having the above properties can be applied to other light emitting devices having other structures, for example, a horizontal type light emitting device.

As described in Table 1, the first passivation layer 40 includes at least one of Si, N, Ti or O, for example, $SiO_2$, $Si_3N_4$, $TiO_2$, SiN, and TiN. Otherwise, the first passivation layer 40 may include a SOG (spin on glass).

In addition, the second passivation layer 50 includes at least one of polyimide based polymer material, acryl based polymer material or epoxy based polymer material. In detail, the polyimide based material includes HD series (manufacturer: HD MicroSystems) and Durimide series (manufacturer: Fuji Film). The acryl based material includes WPR series (manufacturer: JSR). The epoxy based material includes SU-8 3000 series (manufacturer: KMCC, Gerstel Tech).

Meanwhile, although the present embodiment has been described with reference to the light emitting device including the GaN semiconductor material, the present embodiment can be applied to the light emitting device using other semiconductor materials, such as GaAs based material or InGaP based material.

Although few embodiments of the present embodiment have been shown and described, the above embodiment is illustrative purpose only, and it would be appreciated by those skilled in the art that changes and modifications, which have not been illustrated above, may be made in these embodiments without departing from the principles and scope of the embodiment, the scope of which is defined in the claims and their equivalents.

INDUSTRIAL APPLICABILITY

The embodiment can be applied to a light emitting device used as a light source for an illumination device or an electronic device.

The invention claimed is:

1. A light emitting device, comprising:
a light emitting semiconductor layer comprising a first conductive semiconductor layer, an active layer and a second conductive semiconductor layer;
an electrode layer on the first conductive semiconductor layer;
a first passivation layer on the light emitting semiconductor layer; and
a second passivation layer on the first passivation layer,
wherein the first passivation layer comprises an inorganic material,
wherein the second passivation layer comprises an organic material,
wherein the first conductive semiconductor layer has a top surface that has a downwardly-recessed groove, a plurality of protrusions being disposed on a bottom surface of the groove,
wherein the electrode layer is disposed on a bottom surface of the groove, and
wherein the electrode layer substantially has the same top surface as that of the top surface of the first conductive semiconductor layer.

2. The light emitting device as claimed in claim 1, wherein the first passivation layer has a dielectric constant of $2.0 \times 10^{-6}$ to $200 \times 10^{-6}$.

3. The light emitting device as claimed in claim 1, wherein adhesion strength between the first passivation layer and the second passivation layer is 40 MPa to 1000 MPa.

4. The light emitting device as claimed in claim 1, further comprising a coupling metal layer and a support layer on the second passivation layer.

5. The light emitting device as claimed in claim 1, wherein the first passivation layer comprises at least one of Si, N, Ti, O, or an SOG (spin on glass).

6. The light emitting device as claimed in claim 1, wherein the first passivation layer comprises at least one of $SiO_2$, $Si_3N_4$, $TiO_2$, SiN, or TiN.

7. The light emitting device as claimed in claim 1, wherein the second passivation layer comprises at least one of polyimide based polymer material, acryl based polymer material or epoxy based polymer material.

8. A light emitting device, comprising:
a support layer;
a first electrode layer on the support layer;
a light emitting semiconductor layer on the first electrode layer and comprising a first conductive semiconductor layer, an active layer and a second conductive semiconductor layer;
a second electrode layer on the first conductive semiconductor layer of the light emitting semiconductor layer;
a first passivation layer which surrounds the light emitting semiconductor layer and comprises an inorganic material; and
a second passivation layer which surrounds the first passivation layer and comprises an organic material,
wherein the first conductive semiconductor layer has a top surface that has a downwardly-recessed groove, a plurality of protrusions being disposed on a bottom surface of the groove,
wherein the second electrode layer is disposed on a bottom surface of the groove, and
wherein the second electrode layer substantially has the same top surface as that of the top surface of the first conductive semiconductor layer.

9. The light emitting device as claimed in claim 8, further comprising a coupling metal layer between the support layer and the first electrode layer.

10. The light emitting device as claimed in claim 8, wherein the second passivation layer has an elastic modulus of 2.0 GPa to 4.0 GPa.

11. The light emitting device as claimed in claim 8, wherein the first passivation layer has a dielectric constant of $2.0 \times 10^{-6}$ to $200 \times 10^{-6}$.

12. The light emitting device as claimed in claim 8, wherein adhesion strength between the first passivation layer and the second passivation layer is 40 MPa to 1000 MPa.

13. The light emitting device as claimed in claim 8, wherein the first passivation layer comprises at least one of $SiO_2$, $Si_3N_4$, $TiO_2$, SiN, or TiN.

14. The light emitting device as claimed in claim 8, wherein the second passivation layer comprises at least one of polyimide based polymer material, acryl based polymer material or epoxy based polymer material.

15. The light emitting device as claimed in claim 1, wherein the second passivation layer has an elastic modulus of 2.0 GPa to 4.0 GPa.

16. The light emitting device as claimed in claim 1, wherein a thickness of the second passivation layer is greater than a thickness of the first passivation layer.

17. The light emitting device as claimed in claim 8, wherein a thickness of the second passivation layer is greater than a thickness of the first passivation layer.

* * * * *